(12) United States Patent
Liu et al.

(10) Patent No.: US 8,999,802 B2
(45) Date of Patent: Apr. 7, 2015

(54) METHOD FOR MANUFACTURING SEMICONDUCTOR DEVICE BY SELECTIVELY REMOVING END PORTIONS OF GATE DIELECTRIC LAYER AND THEN FILLING END PORTIONS WITH DIELECTRIC LAYER

(75) Inventors: Yunfei Liu, Beijing (CN); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 2 days.

(21) Appl. No.: 13/813,554

(22) PCT Filed: Jul. 30, 2012

(86) PCT No.: PCT/CN2012/079348
§ 371 (c)(1),
(2), (4) Date: Jan. 31, 2013

(87) PCT Pub. No.: WO2014/012271
PCT Pub. Date: Jan. 23, 2014

(65) Prior Publication Data
US 2014/0087538 A1    Mar. 27, 2014

(30) Foreign Application Priority Data

Jul. 18, 2012    (CN) .......................... 2012 1 0249429

(51) Int. Cl.
| H01L 21/336 | (2006.01) |
| H01L 21/8234 | (2006.01) |
| H01L 21/31 | (2006.01) |
| H01L 21/469 | (2006.01) |
| H01L 29/66 | (2006.01) |
| H01L 21/265 | (2006.01) |
| H01L 21/28 | (2006.01) |
| H01L 29/78 | (2006.01) |

(52) U.S. Cl.
CPC .... *H01L 29/66492* (2013.01); *H01L 21/26513* (2013.01); *H01L 21/26586* (2013.01); *H01L 21/28158* (2013.01); *H01L 29/6659* (2013.01); *H01L 29/7833* (2013.01)

(58) Field of Classification Search
CPC ................................................ H01L 29/66803
See application file for complete search history.

(56) References Cited

U.S. PATENT DOCUMENTS

| 6,306,715 | B1 | 10/2001 | Chan et al. | |
| 6,437,406 | B1 * | 8/2002 | Lee ............................... | 257/349 |
| 6,458,666 | B2 | 10/2002 | Wasshuber | |

(Continued)

FOREIGN PATENT DOCUMENTS

CN    101556957 A    10/2009

OTHER PUBLICATIONS

International Search Report and Written Opinion (in Chinese) for PCT Application No. PCT/CN2012/079348, dated Oct. 18, 2012, 9 pages.

*Primary Examiner* — Michael Jung
(74) *Attorney, Agent, or Firm* — Westman, Champlin & Koehler, P.A.

(57) ABSTRACT

A method for manufacturing a semiconductor device is disclosed. In one embodiment, the method comprises: forming a gate stack on a substrate, wherein the gate stack comprises a gate dielectric layer and a gate conductor layer; selectively etching end portions of the gate dielectric layer to form gaps; and filling a material for the gate dielectric layer into the gaps.

11 Claims, 2 Drawing Sheets

(56) References Cited

U.S. PATENT DOCUMENTS

| | | |
|---|---|---|
| 6,720,630 B2 | 4/2004 | Mandelman et al. |
| 6,849,925 B1 * | 2/2005 | Halliyal et al. ............... 257/635 |
| 7,001,817 B2 * | 2/2006 | Yeo et al. ...................... 438/299 |
| 7,432,156 B1 * | 10/2008 | Lee et al. ...................... 438/260 |
| 7,897,514 B2 * | 3/2011 | Liu et al. ....................... 438/682 |
| 7,947,588 B2 * | 5/2011 | Yu et al. ........................ 438/585 |
| 7,984,408 B2 * | 7/2011 | Cheng et al. .................. 716/119 |
| 2013/0234218 A1 * | 9/2013 | Dornel et al. .................. 257/288 |

* cited by examiner

METHOD FOR MANUFACTURING SEMICONDUCTOR DEVICE BY SELECTIVELY REMOVING END PORTIONS OF GATE DIELECTRIC LAYER AND THEN FILLING END PORTIONS WITH DIELECTRIC LAYER

CROSS-REFERENCE TO RELATED APPLICATION

This Application is a Section 371 National Stage Application of International Application No. PCT/CN2012/079348, filed 30 Jul. 2012 and is not yet published in the international stage, in Chinese, the contents of which are hereby incorporated by reference in their entirety.

This application claims priority to Chinese Application No. 201210249429.5, entitled "METHOD FOR MANUFACTURING SEMICONDUCTOR DEVICE," filed on Jul. 18, 2012, which is incorporated herein by reference in their entirety.

TECHNICAL FIELD

The present disclosure relates to the semiconductor field, and particularly, to a method for manufacturing a semiconductor device.

BACKGROUND

In semiconductor processes, tilted ion implantation is often carried out. For example, in forming source/drain regions for CMOS devices by the ion implantation process, generally the ion implantation is performed in a tilt angle, to form shallow junctions so as to avoid the tunneling effect. Further, in manufacturing short channel devices, generally halo implantation is performed in a relatively large tilt angle, to suppress short channel effects.

However, the tilted ion implantation may cause implanted ions pass through a gate dielectric layer, and thus cause damages on the gate dielectric layer. As a result, a resulting device may become failed due to sharp increase of the gate leakage current. This problem becomes particularly serious when implanting large-sized impurity ions, such as P, Ge, and As, in a great dose with a high energy.

One conventional solution to the problem is to deposit a dielectric spacer (e.g., silicon oxide or silicon nitride) on side walls of a gate stack prior to the ion implantation process, to alleviate the damages on the gate dielectric layer caused by the implanted ions. However, it is impossible to completely eliminate the damages on the gate dielectric layer with this solution. As a result, the resulting device has its performances degraded to some extent.

SUMMARY

The present disclosure provides, among others, a semiconductor device and a method for manufacturing the same.

According to an aspect of the present disclosure, there is provided a method for manufacturing a semiconductor device, comprising: forming a gate stack on a substrate, wherein the gate stack comprises a gate dielectric layer and a gate conductor layer; selectively etching end portions of the gate dielectric layer to form gaps; and filling a material for the gate dielectric layer into the gaps.

The gate dielectric layer is processed by selectively etching the end portions thereof and then filling the gate dielectric material back into the end portions. In this way, it is possible to remove potential damages at the end portions of the gate dielectric layer, for example, those caused by tilted ion implantation.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
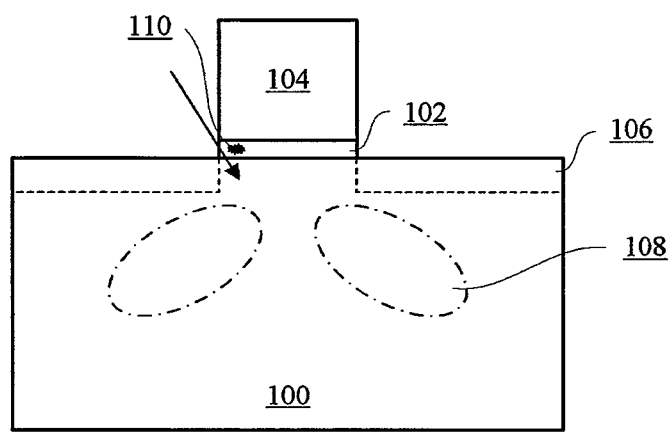
FIGS. 1-3 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, and relative sizes and positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

As shown in FIG. 1, a substrate 100 is provided. The substrate 100 may comprise any suitable substrate, including, but not limited to, a bulk semiconductor substrate such as a bulk Si substrate, a Semiconductor on Insulator (SOI) substrate, a SiGe substrate, and the like. For convenience, the following descriptions are given with respect to the bulk Si substrate by way of example.

On the substrate 100, a gate stack may be formed. For example, the gate stack may comprise a gate dielectric layer 102 and a gate conductor layer 104. The gate dielectric layer 102 may comprise a. dielectric material such as silicon oxide, or a high-K dielectric material. The gate conductor layer 104 may comprise polysilicon or a metal gate conductor. In a case where the gate dielectric layer 102 comprises the high-K dielectric material and the gate conductor layer 104 comprises the metal gate conductor, there may be a work-function adjustment layer (not shown) interposed between the gate dielectric layer 102 and the gate conductor layer 104. Then, ion implantation may be performed with the gate stack as a mask, to form source/drain regions 106.

Prior to the source/drain implantation, tilted ion implantation may be performed, as indicated by arrows in FIG. 1, to form, for example, a halo arrangement 108 or a Lightly Doped Drain (LDD) arrangement. During the process of the tilted ion implantation, implanted ions may pass through the gate dielectric layer 102, especially end portions thereof, and thus cause damages 110 in the gate dielectric layer 102.

Figure 2:
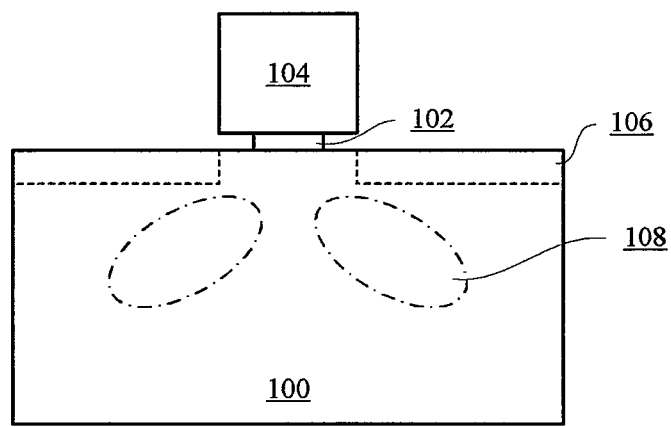

Next, as shown in FIG. 2, the end portions of the gate dielectric layer 102, especially regions having the damages 110 included therein, may be removed by selective etching. For example, such selective etching may be accomplished by wet etching, dry etching, or a combination thereof. For example, the structure shown in FIG. 1 may be immersed into an etching solution. The etching solution may comprise an HF solution diluted at a ratio of about 100:1. During the etching process, etching time can be controlled in such a manner that the regions at the end portions of the gate dielectric layer 102, which are impacted by the tilted ion implantation (and thus have the damages 110 included therein), can be removed.

According to an embodiment of the present disclosure, the etching time can be determined based on an etching rate of the gate dielectric layer and an amount of the gate dielectric layer to be etched, for example. The etching rate of the gate dielectric layer depends on various factors, such as the material of the gate dielectric layer itself, the etching recipe, the ambient temperature, and the like. The amount of the gate dielectric layer to be etched depends on a tilt angle of the ion implantation, the implantation energy, the implantation dose, and the like.

Figure 3:
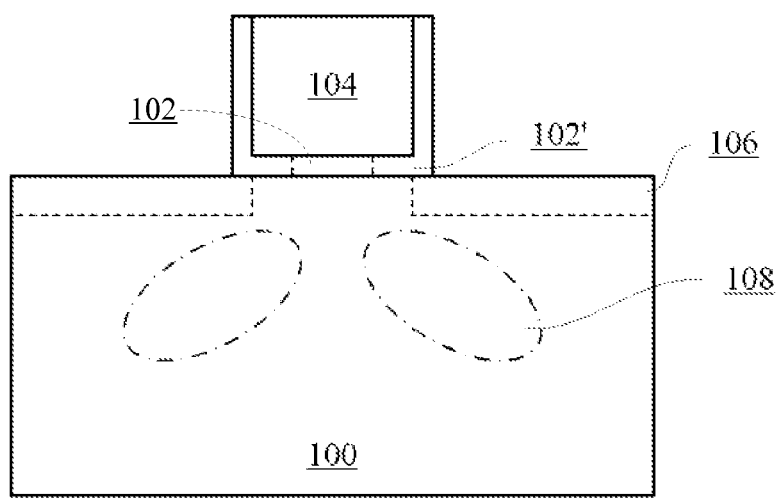

Subsequently, as shown in FIG. 3, the material (e.g., silicon oxide) for the gate dielectric layer may be filled into the end portions of the gate dielectric layer 102 (particularly, gaps due to the above selective etching), to form a gate dielectric layer 102' which is substantially damage free. For example, the filling can be achieved by depositing a thick layer of the gate dielectric material on the substrate 100 and then etching it back. The depositing can be achieved by Low Pressure Chemical Vapor Deposition (LPCVD) or Atom Layer Deposition (ALD). According to an example of the present disclosure, in the process of etching back, portions of the gate dielectric material on side walls of the gate stack can be reserved by controlling parameters adopted in the etching process, and thus serve as a first spacer for the gate stack. The process of etching back to form the spacer is known in the art, and detailed descriptions thereof are omitted here.

Thus, a device is achieved. As shown in FIG. 3, the device may comprise the substrate 100 and the gate stack formed on the substrate 100. The gate stack comprises the gate dielectric layer 102' and the gate conductor layer 104. The gate dielectric layer 102' may comprise filled portions at the end portions thereof. Optionally, the filled portions extend along the side walls of the gate stack, and thus serve as the first spacer of the gate stack.

Here, it is to be noted that the above descriptions are given with respect to the case where the damages are caused in the gate dielectric layer by the tilted ion implantation and thus the selective etching and filling of the gate dielectric layer are performed. However, the present disclosure is not limited thereto. For example, the selective etching and filling of the gate dielectric layer can be performed, even without tilted ion implantation, so as to remove possible damages at the end portions of the gate dielectric layer.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a semiconductor device, comprising:
    forming a gate stack on a substrate, wherein the gate stack comprises a gate dielectric layer and a gate conductor layer, wherein sidewalls of the gate dielectric layer are aligned with side walls of the gate conductor layer;
    performing tilted ion implantation at least partially via the gate dielectric layer;
    selectively etching end portions of the gate dielectric layer to form gaps so as to recess side walls of the gate dielectric layer with respect to respective side walls of the gate conductor layer; and
    filling a material for the gate dielectric layer into the gaps, wherein filling the material for the gate dielectric layer into the gaps comprises depositing the material and then etching it back, wherein portions of the material on side walls of the gate stack are reserved during the process of etching back to serve as a first spacer for the gate stack.

2. The method according to claim 1, wherein depositing is achieved by Low Pressure Chemical Vapor Deposition (LPCVD) or Atom Layer Deposition (ALD).

3. The method according to claim 1, wherein the selective etching is achieved by wet etching, dry etching, or a combination thereof.

4. The method according to claim 3, wherein the wet etching is achieved by an HF solution.

5. The method according to claim 1, wherein in the process of selectively etching the end portions of the gate dielectric layer, etching time is controlled in such a manner that portions which are impacted by tilted ion implantation at the end portions of the gate dielectric layer can be removed.

6. The method according to claim 1, wherein the titled ion implantation is performed after forming the gate stack and before selective etching the end portions of the gate stack.

7. The method according to claim 1, wherein the tilted ion implantation is performed to form a halo or a Lightly Doped Drain (LDD).

8. The method according to claim 1, wherein the etching removes at least some of regions at the end portions which are impacted by the tilted ion implantation.

9. The method according to claim 1, further comprising:
    forming source/drain regions with the gate stack as a mask.

10. The method according to claim 9, wherein the tilted ion implantation is performed prior to the forming of the source/drain regions.

11. The method according to claim 1, wherein in the etching, an amount of the gate dielectric layer at the end portions to be etched depends on at least one of a tilt angle, implantation energy, and implantation dose of the tilted ion implantation.

* * * * *